United States Patent [19]

Koike

[11] Patent Number: 4,568,842
[45] Date of Patent: Feb. 4, 1986

[54] D-LATCH CIRCUIT USING CMOS TRANSISTORS

[75] Inventor: Hideharu Koike, Yokohama, Japan

[73] Assignee: Tokyo Shibaura Denki Kabushiki Kaisha, Japan

[21] Appl. No.: 572,755

[22] Filed: Jan. 23, 1984

[30] Foreign Application Priority Data

Jan. 24, 1983 [JP] Japan .................................. 58-9663

[51] Int. Cl.$^4$ ................. H03K 19/003; H03K 19/096; H03K 3/356; G11C 11/40
[52] U.S. Cl. .................................... 307/279; 307/288; 307/272 A; 307/452; 307/585; 377/117; 377/121; 377/127
[58] Field of Search ............... 307/452, 453, 481, 576, 307/579, 583, 585, 272 A, 272 R, 288, 605, 279; 377/74, 79, 68, 105, 115, 116, 117, 121, 127

[56] References Cited

U.S. PATENT DOCUMENTS

| | | | |
|---|---|---|---|
| T955,006 | 2/1977 | Cavaliere et al. | 307/585 |
| 3,720,841 | 3/1973 | Suzuki | 307/481 |
| 3,937,982 | 2/1976 | Nakajima | 307/452 |
| 4,122,360 | 10/1978 | Kawagai et al. | 307/452 |
| 4,255,723 | 3/1981 | Ebihara | 307/452 X |
| 4,472,643 | 9/1984 | Furuyama | 307/583 X |
| 4,521,695 | 6/1985 | Mazin et al. | 307/452 X |
| 4,532,439 | 7/1985 | Koike | 307/279 X |

OTHER PUBLICATIONS

Elmasry et al., "A DOL CMOS Static Memory Cell," IEEE Journal of Solid-State Circuits, vol. SC-16, No. 5, Oct. 1981.

Primary Examiner—Stanley D. Miller
Assistant Examiner—David R. Bertelson
Attorney, Agent, or Firm—Finnegan, Henderson, Farabow, Garrett & Dunner

[57] ABSTRACT

A latch circuit includes a CMOS inverter to which a logic signal is applied to the input through an input terminal, which inverter continues to supply an output signal to its output terminal; and first depletion type p and n-channel MOS transistors connected in series to each other, with the CMOS inverter being interposed therebetween. The latch circuit further includes second depletion type n and p-channel MOS transistors which are supplied, at their gates, with an output signal from the CMOS inverter; the second n-channel MOS transistor being connected between the first p-channel MOS transistor and a power supply terminal, and the second p-channel MOS transistor being connected between the first n-channel MOS transistor and a ground.

8 Claims, 3 Drawing Figures

D-LATCH CIRCUIT USING CMOS TRANSISTORS

BACKGROUND OF THE INVENTION

The present invention relates to a latch circuit which is so arranged as to hold a logic signal in response to a control pulse.

A shift-register may consist of a plurality of D-type flip-flops. FIG. 1 shows a known D-type flip-flop, which is comprised of a master latch circuit 10 for holding an input signal from a terminal IN, and a slave latch circuit 12 for holding an output signal from the latch circuit 10. The latch circuit 10 has a transfer gate 14 to which a logic signal to be held with a prescribed timing is supplied, another transfer gate 16 connected in series to this transfer gate 14, and a serial circuit of inverters 18, 20 which is connected in parallel to the other transfer gate 16. The slave latch circuit 12 has transfer gates 22, 24 and inverters 26, 28 which are assembled in the same manner as in the latch circuit 10. The transfer gates 14, 16, 22, 24 control the passing of respective input signals in accordance with clock pulses $\phi$, $\bar{\phi}$ which are opposite to each other in phase. Each of the transfer gates 14, 24 is a parallel circuit comprised of an n-channel MOS transistor supplied with clock pulse $\phi$ at its gate, and a p-channel MOS transistor connected in parallel thereto and supplied with clock pulse $\bar{\phi}$ at its gate. Each of the transfer gates 16, 22 is similarly constituted by a parallel circuit comprised of an n-channel MOS transistor supplied with clock pulse $\bar{\phi}$ at its gate, and a p-channel MOS transistor supplied with clock pulse $\phi$ at its gate. The transfer gates 14, 16 are in such a relationship that, when one of them is kept conductive, the other is kept nonconductive. Transfer gate 22 is rendered conductive when transfer gate 16 is kept conductive. On the other hand, transfer gate 24 is rendered conductive when transfer gate 22 is kept nonconductive. Each of the inverters 18, 20, 26 and 28 has a p-channel MOS transistor and an n-channel MOS transistor, both of which operate in a complementary fashion.

However, the above-mentioned flip-flop has the following drawbacks. First of all, said flip-flop is composed of a relatively large number of transistors. For this reason, when the shift-register is formed on a semiconductor chip, for example, a large part of the chip area is occupied by the shift-register, disadvantageously. Further, the noise margin and the power source voltage margin of each latch circuit 10 or 12 are determined by the threshold voltages of the transistors involved. For this reason, when one of these two margins is set large, the other margin becomes small. Further, with the above-mentioned flip-flop all of the transistors 14, 16, 22 and 24 may be instantaneously rendered conductive, due to a slight displacement between a rising of clock pulse $\phi$ and a falling of clock pulse $\bar{\phi}$. At this time, the flip-flop falls into a state of racing, wherein an unstable logic signal is output.

SUMMARY OF THE INVENTION

In view of the above, the primary object of the present invention is to provide a latch circuit which, though composed of a smaller number of circuit elements, can operate stably.

According to the present invention, there is provided a latch circuit comprising first and second potential terminals, a CMOS inverter to which a logic signal is applied to the input, first and second MOS transistors connected in series through a current path of the CMOS inverter and supplied, at their gates, with first and second control signals which are opposite in phase to each other, respectively, a third MOS transistor of a depletion type connected between the first MOS transistor and first potential terminal and supplied, at its gate, with an output signal from the CMOS inverter, and a fourth MOS transistor of a depletion type connected between the second MOS transistor and second potential terminal and supplied, at its gate, with an output signal from the CMOS inverter.

DETAILED DESCRIPTION OF THE PREFERRED EMBODIMENTS

Figure 2:
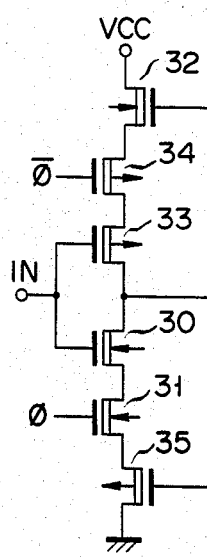
FIG. 2 is a circuit diagram of a latch circuit according to an embodiment of the present invention.

FIG. 2 shows a latch circuit according to an embodiment of the present invention. This latch circuit is provided with depletion type n-channel MOS transistors 30 to 32 and depletion type p-channel MOS transistors 33 to 35. The transistors 30 and 33 constitute a CMOS inverter. The gates of the transistors 30 and 33 are connected to a terminal IN to which a logic signal is supplied and the drains thereof are connected to a terminal OUT. The gates of the transistors 31 and 34 are supplied with respective control pulses $\phi$ and $\bar{\phi}$ which are opposite in phase to each other. An output signal of the CMOS inverter is supplied to the gates of the transistors 32 and 35. The source of the transistor 32 is connected to the source of the transistor 33 through the transistor 34. The drain of the transistor 32 is connected to a power supply terminal VCC. The source of the transistor 35 is connected to the source of the transistor 30 through the transistor 31. The drain of the transistor 35 is grounded.

Next, the operation of the latch circuit having the above-mentioned construction will be described. The n-channel transistors 30 to 32 of a depletion type can be conductive when the source voltage VS is lower in level than a sum of the gate voltage VG and the absolute value of the threshold voltage VT; (VS<VG+|VT|). The p-channel transistors 33 to 35 of a depletion type can be conductive when the source voltage VS is higher in level than the difference obtained by subtracting the absolute value of the threshold voltage VT from the gate voltage VG; (VS>VG−|VT|).

For example, when control pulse $\phi$ rises and control pulse $\bar{\phi}$ falls, during the period of time in which the logic signal at a high level "H" (=5 V) is input to the CMOS inverter, the resistance values of transistors 30, 31 and 34 are minimized, and the resistance value of transistor 33 is elevated. Assuming that the output signal from the CMOS inverter has a high level "H" (=5 V), the resistance value of transistor 32 will be low and the resistance value of transistor 35 will be high. At this time, the voltage drop occurring in transistors 30, 31 and 35 is substantially equal to the voltage drop occurring in transistors 32, 33 and 34. Therefore, the output signal substantially at a level of VCC/2 is supplied to the terminal OUT. When, in this way, the output signal falls to a low voltage level, the resistance value of transistor 32 increases and the resistance value of transistor 35 decreases. As a consequence, the voltage level VO of the output signal from the CMOS inverter becomes smaller than the value obtained by subtracting the absolute value of a threshold voltage VTP1 of transistor 33 and the absolute value of a threshold voltage VTN3 of transistor 32 from the voltage level VI (=5 V) of the logic signal from the terminal IN; (VO<-VI−|VTP1|−|VTN3|). As a consequence, transistors 32 and 33 become nonconductive. At this time, an output signal with a low level "L" (=0 V) is produced at the terminal OUT. Further, when control pulse $\phi$ rises, control pulse $\bar\phi$ falls and the logic signal at the terminal IN rises, the above-mentioned variation in output voltage level will not occur if an output signal at a low level "L" (=0 V) has been supplied to the terminal OUT from the CMOS inverter.

On the other hand, when control pulse $\phi$ rises and control pulse $\bar\phi$ falls during a period of time in which the logic signal at a low level "L" (=0 V) is input to the CMOS inverter, the resistance values of transistors 31, 33 and 34 decrease and the resistance value of transistor 30 increases. When it is now assumed that the output signal from the CMOS inverter has a low level "L" (=0 V), then the resistance value of the transistor 32 is large and the resistance value of the transistor 35 is small. Since, at this time, the voltage drop occurring in the transistors 30, 31 and 35 becomes substantially equal to the voltage drop occurring in the transistors 32, 33 and 34, the output signal substantially at a level of VCC/2 is supplied to the terminal OUT. Thus, when the output signal increases in voltage level, the resistance value of transistor 32 decreases; while, on the other hand, the resistance value of transistor 35 increases. Thus, the voltage level VO of the output signal from the CMOS inverter becomes higher than a level which corresponds to the sum of three values, viz., the voltage level VI (=0 V) of the logic signal from the terminal IN, the absolute value of the threshold voltage VTN1 of transistor 30, and the absolute value of the threshold voltage VTP3 of transistor 35; (VO>-VI+|VTN1|+|VTP3|). As a consequence, transistors 30 and 35 become nonconductive. At this time, an output signal with a high level "H" (=5 V) is produced at the terminal OUT. Further, when control pulse $\phi$ rises, control pulse $\bar\phi$ falls and the logic signal at the terminal IN falls, the abovementioned variation in output voltage level will not occur if an output signal at a high level "H" (=5 V) has been supplied to the terminal OUT from the CMOS inverter.

When control pulse $\phi$ falls and control pulse $\bar\phi$ rises after determination, in the above-mentioned manner, of the voltage level of the output signal from the CMOS inverter, the resistance values of transistors 31 and 34 increase. For example, when the voltage level VO of the output signal from the CMOS inverter is a low level "L" (=0 V), the transistors 32 and 34 become nonconductive and the transistors 30, 31, 35 are rendered conductive. At this time, the inequalities of VCC>|VTP2|+|VTN3| and VO<|VTN2|+|VTP3| hold true (where VTP2 represents the threshold voltage level of the transistor 34; VTN3 represents the threshold voltage of the transistor 32; VTN2 represents the threshold voltage of transistor 31; and VTP3 represents the threshold voltage of transistor 35). Accordingly, the output signal supplied to the terminal OUT is maintained at a low level "L" (=0 V) regardless of the voltage level of the logic signal which is input to the CMOS inverter. When the output signal of the CMOS inverter has a high voltage level "H" (=5 V), the transistors 31 and 35 become nonconductive and the transistors 32, 34 and 33 are rendered conductive. At this time, the inequalities of VCC>|VTN2|+|VTP3| and VO>VCC−|VTP2|−|VTN3| are kept to hold true (where VTN2 represents the threshold voltage of the transistor 31; VTP3 represents the threshold voltage of the transistor 35; VTP2 represents the threshold voltage of the transistor 34; and VTN3 represents the threshold voltage of transistor 32). Accordingly, the output signal supplied to the terminal OUT is maintained at a high voltage level "H" (=5 V), independently of the voltage level of the logic signal input to the CMOS inverter.

As mentioned above, the latch circuit according to this embodiment is so arranged that, when control pulses $\phi$ and $\bar\phi$ have logic levels "H" and "L", respectively, the logic signal supplied to the terminal IN is inverted by the CMOS inverter, permitting the logic signal thus inverted to be output from the terminal OUT. Further, when control pulses $\phi$ and $\bar\phi$ have logic levels "L" and "H", respectively, the outputting of that inverted logic signal is maintained in the latch circuit. Thus, in this latch circuit, the latching function is actualized with the use of only six transistors. Accordingly, since use of the present latch circuits only requires that a small area be occupied thereby, when such circuits are formed on a semiconductor chip, such circuits are very advantageous when used to constitute, for example, a shift-register. In actuality, the area occupied by such circuits is around ½ of the area which was conventionally occupied on the semiconductor chip.

Further, this latch circuit, functioning as an inverter, has different threshold voltages VTL, VTH. If the voltage level VI is increased from a low level (=0 V), and when this voltage level VI reaches the threshold voltage VTH, the output signal from the latch circuit is inverted. If the voltage level VI is increased from a high level (=5 V), and when this voltage level VI reaches the threshold voltage VTL, the output signal from the latch circuit is inverted. The low and high threshold voltages VIL, VIH are expressed as follows.

$$VIL = |VTP1| + |VTN3|$$

$$VIH = VCC - |VTP3| - |VTN1|,$$

provided however,
that 0<VIL<VCC and 0<VIH<VCC. Further, the noise margins MIL, MIH are defined as follows.

$$MIL = VCC - VIL$$

$$MIH = VIH$$

Thus, it is possible to expand the noise margin by increasing the power source voltage VCC of the latch circuit.

Further, in this latch circuit, the noise margin is determined with reference to the level of the power source voltage VCC, although the minimal power source voltage of the inverter is determined on the basis of the threshold voltage level. Accordingly, it is possible to enlarge the noise margin without increasing the minimal power source voltage of the inverter.

Figure 1:
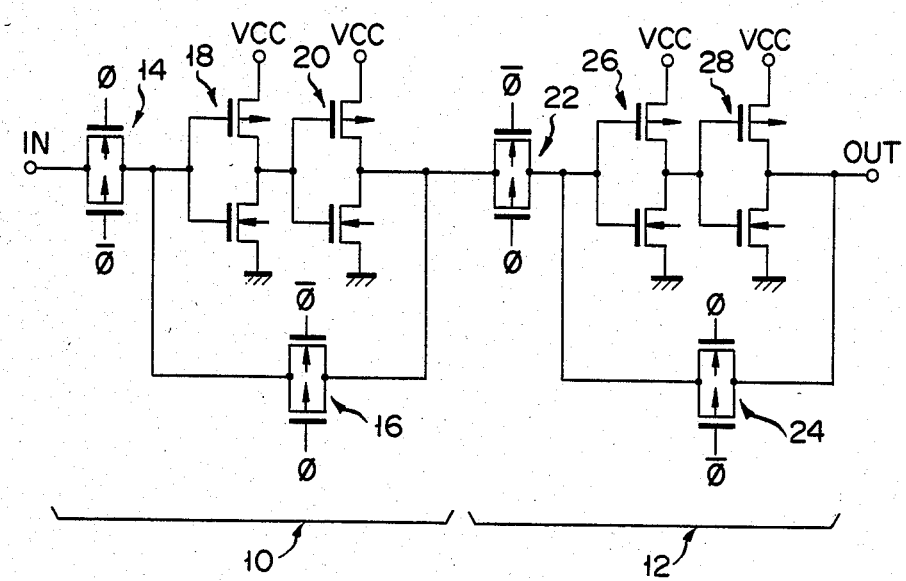
FIG. 1 is a circuit diagram of a known D-type flip-flop.
Figure 3:
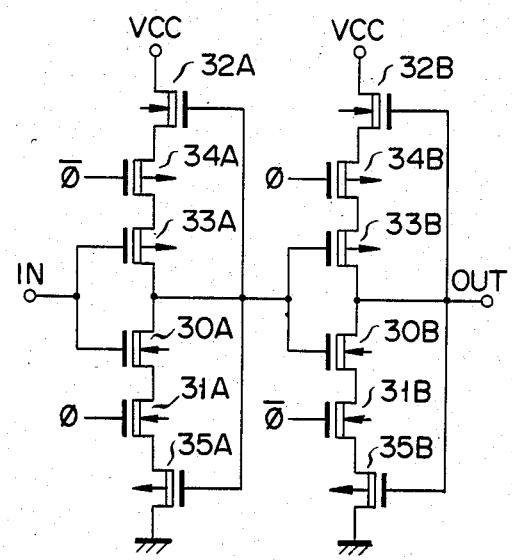
FIG. 3 is a circuit diagram of a latch circuit according to another embodiment of the present invention, wherein two of the latch circuits shown in FIG. 1 are interconnected in series.

FIG. 3 shows the latch circuit according to another embodiment of the present invention. This latch circuit comprises two cascade-connected circuits, each having the same construction as that of the latch circuit shown in FIG. 1. In the latch circuit of FIG. 3, however, control pulse $\phi$ is supplied to transistors 31A and 34B and control pule $\bar{\phi}$ is supplied to transistors 34A and 31B. It is known that a shift register having clocked CMOS inverters connected in series does not fall into a racing state due to the skew of control pulses. Following issues (1), (2), for reference, explain this matter in detail.

(1) Y. SUZUKI, et al. IE³ J. Solid State Circuits, vol. SC-8, pp. 462–469, 1973.

(2) N.F. Goncalves, et al. Proceedings of ES-SCIRC'82 pp. 141–144, 1982.

A latch circuit of FIG. 3, having a fashion of the clocked CMOS inverter, operates very stably without falling into a racing state, even when some displacement occurs between the rise of control pulse $\phi$ and the fall of control pulse $\bar{\phi}$.

As described above, though the latch circuit according to the present invention has a smaller number of circuit elements, its operation is highly stable.

In each of the above-mentioned embodiments, the CMOS inverter may be composed of transistors of the enhancement type, as well; and the transistors to which the control pulses $\phi$, $\bar{\phi}$ are supplied may also be of the enhancement type. In the case of using transistors of the enhancement type, the latching operation is not static.

What is claimed is:

1. A latch circuit comprising:
   first and second potential terminals;
   a CMOS inverter to which a logic signal is applied to the input;
   first and second MOS transistors connected in series to each other through a current path of said CMOS inverter and supplied, at their gates, with first and second control signals which are opposite in phase to each other, respectively;
   a third MOS transistor of a depletion type connected between said first MOS transistor and said first potential terminal and supplied, at its gate, with an output signal from said CMOS inverter; and
   a fourth MOS transistor of a depletion type connected between said second MOS transistor and said second potential terminal and supplied, at its gate, with an output signal from said CMOS inverter.

2. A latch circuit according to claim 1, wherein said CMOS inverter includes a fifth MOS transistor of one conductivity type and a sixth MOS transistor of an opposite conductivity type, one end of the current path of said fifth MOS transistor being connected to said first MOS transistor, the other end of the current path of said fifth MOS transistor being connected to said second MOS transistor through the current path of said sixth MOS transistor, and a logic signal being supplied to the gates of said fifth and sixth MOS transistors.

3. A latch circuit according to claim 2, wherein said first, fourth and fifth MOS transistors are p-channel MOS transistors; and said second, third and sixth MOS transistors are n-channel MOS transistors.

4. A latch circuit according to claim 3, wherein said first, second, fifth and sixth MOS transistors are each of a depletion type.

5. A latch circuit comprising:
   first and second potential terminals;
   a first CMOS inverter to which a logic signal is applied to the input;
   first and second MOS transistors connected in series to each other through a current path of said first CMOS inverter and supplied, at their gates, with first and second control signals which are opposite in phase to each other, respectively;
   a third MOS transistor of a depletion type connected between said first MOS transistor and said first potential terminal and supplied, at its gate, with an output signal from said first CMOS inverter;
   a fourth MOS transistor of a depletion type connected between said second MOS transistor and said second potential terminal and supplied, at its gate, with an output signal from said first CMOS inverter;
   a second CMOS inverter to which the output signal from said first CMOS inverter is supplied;
   fifth and sixth MOS transistors connected in series to each other through a current path of said second CMOS inverter and supplied, at their gates, with said second and first control signals, respectively;
   a seventh MOS transistor of a depletion type connected between said fifth MOS transistor and said first potential terminal and supplied, at its gate, with an output signal from said second CMOS inverter; and
   an eighth MOS transistor of a depletion type connected between the sixth MOS transistor and said second potential terminal and supplied, at its gate, with the output signal from said second CMOS inverter.

6. A latch circuit according to claim 5, wherein said first CMOS inverter includes a ninth MOS transistor of one conductivity type and a tenth MOS transistor of an opposite conductivity type, one end of the current path of said ninth MOS transistor being connected to said first MOS transistor, the other end of the current path of said ninth MOS transistor being connected to said second MOS transistor through the current path of said tenth MOS transistor, and a logic signal being supplied to the gates of said ninth and tenth MOS transistors; and wherein said second inverter includes an eleventh MOS transistor of one conductivity type and a twelfth MOS transistor of an opposite conductivity type, one end of the current path of said eleventh MOS transistor being connected to said fifth MOS transistor, the other end of the current path of said eleventh MOS transistor being connected to said sixth MOS transistor through the current path of said twelfth MOS transistor, and an output signal from said first inverter being supplied to the gates of said eleventh and twelfth MOS transistors.

7. A latch circuit according to claim 6, wherein said first, fourth, fifth, eighth, ninth and eleventh MOS transistors are p-channel MOS transistors; and said second, third, sixth, seventh, tenth and twelfth MOS transistors are n-channel MOS transistors.

8. A latch circuit according to claim 7, wherein said first, second, fifth, sixth, ninth, tenth, eleventh and twelfth MOS transistors are each of a depletion type.

* * * * *